United States Patent
Park et al.

(10) Patent No.: US 10,530,618 B1
(45) Date of Patent: Jan. 7, 2020

(54) SINGLE-ENDED TO DIFFERENTIAL SIGNAL CONVERSION OF ANALOG SIGNALS

(71) Applicant: QUALCOMM Incorporated, San Diego, CA (US)

(72) Inventors: Joung Won Park, San Diego, CA (US); Ehab Abdel Ghany, San Diego, CA (US); Li-chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/143,198

(22) Filed: Sep. 26, 2018

(51) Int. Cl.
*H03F 3/45* (2006.01)
*H04L 25/08* (2006.01)

(52) U.S. Cl.
CPC ....... *H04L 25/085* (2013.01); *H03F 3/45475* (2013.01); *H03F 2200/165* (2013.01); *H03F 2200/294* (2013.01)

(58) Field of Classification Search
CPC ........................................................ H03F 3/45
USPC .................................................. 330/117, 252
See application file for complete search history.

(56) References Cited

U.S. PATENT DOCUMENTS

| | | | |
|---|---|---|---|
| 7,327,301 B2 | 2/2008 | Tamba | |
| 8,421,541 B2 | 4/2013 | Sengupta et al. | |
| 8,660,513 B2 * | 2/2014 | Sorrells | H03C 1/62 455/313 |
| 9,240,815 B1 | 1/2016 | Wyse | |
| 2009/0318107 A1 * | 12/2009 | Sorrells | H03C 3/40 455/323 |
| 2011/0039511 A1 * | 2/2011 | Rajendran | H04B 1/18 455/326 |
| 2013/0271210 A1 | 10/2013 | Riley | |
| 2014/0132357 A1 | 5/2014 | Larson et al. | |
| 2015/0063509 A1 * | 3/2015 | Hedayati | H04B 15/005 375/350 |

* cited by examiner

*Primary Examiner* — Henry Choe
(74) *Attorney, Agent, or Firm* — Paradice and Li LLP/Qualcomm (57) ABSTRACT

This disclosure provides systems and apparatuses for converting a single-ended analog signal into a differential analog signal. In some implementations, a single-ended to differential signal converter may include an N-path filter to generate a 180 degree phase-shifted version of a single-ended input signal. The single-ended input signal and the 180 degree phase-shifted version of the single-ended input signal together may form a differential signal. In some implementations, the N-path filter may delay the single-ended input through a series of switched capacitors.

26 Claims, 6 Drawing Sheets

(Prior Art)

SINGLE-ENDED TO DIFFERENTIAL SIGNAL CONVERSION OF ANALOG SIGNALS

TECHNICAL FIELD

This disclosure relates generally to signal processing, and specifically to single-ended to differential signal conversion of analog signals.

DESCRIPTION OF THE RELATED TECHNOLOGY

Communication devices often use analog signals during the reception and transmission of communication signals. Analog signals may be single-ended or differential. A single-ended analog signal is carried on a single conductor, and the frequency and amplitude of the analog signal is represented by a voltage on the single conductor. In contrast, the differential signal is carried on two conductors, and the associated voltage and frequency is represented by a voltage difference between the two conductors. The magnitude of the represented signal corresponds to the magnitude of the voltage difference. Single-ended analog signals may have simpler design constraints than differential signals because single-ended analog signals only require a single conductor and differential signals require two conductors. However, single-ended analog signals are more susceptible to noise than differential signals.

Many devices convert single-ended signals to differential signals to take advantage of the inherent noise resistance for differential signals. However, conventional transformer-based conversion methods may be lossy and/or use a large amount of space (area). Thus, there exists a need for an improved single-ended to differential signal converter.

SUMMARY

The systems, methods and devices of this disclosure each have several innovative aspects, no single one of which is solely responsible for the desirable attributes disclosed herein.

One innovative aspect of the subject matter described in this disclosure can be implemented in devices with analog circuits having single-ended analog signals. In some implementations, a single-ended to differential signal converter may include an input terminal, an N-path filter comprising a first terminal coupled to the input terminal and configured to receive a single-ended signal, and a second terminal configured to provide a 180 degree phase-shifted version of the single-ended signal, with the single-ended signal and the 180 degree phase-shifted version of the single-ended signal forming a differential output signal.

Another innovative aspect of the subject matter described in this disclosure can be implemented as another embodiment of a single-ended to differential signal converter. The embodiment may include an input terminal, an N-path filter comprising a first terminal coupled to the input terminal and configured to receive a single-ended signal, a second terminal configured to provide a first delayed version of the single-ended signal, and a third terminal configured to provide a second delayed version of the single-ended signal related to the first delayed version of the single-ended signal by a 180 degree phase shift, with the first delayed version of the single-ended signal and the second delayed version of the single-ended signal forming a differential output signal.

Another innovative aspect of the subject matter described in this disclosure can be implemented as an analog front end of a wireless device comprising an antenna, an amplifier coupled to the antenna, and an N-path filter comprising a first terminal configured to receive the single-ended signal, and a second terminal configured to provide a 180 degree phase-shifted version of the single-ended signal, with the single-ended signal and the 180 degree phase-shifted version of the single-ended signal forming a differential output signal.

Another innovative aspect of the subject matter described in this disclosure can be implemented as another embodiment of an analog front end of a wireless device comprising an antenna, an amplifier coupled to the antenna, and an N-path filter comprising a first terminal configured to receive the single-ended signal, a second terminal configured to provide a first delayed version of the single-ended signal, and a third terminal configured to provide a second delayed version of the single-ended signal related to the first delayed version of the single-ended signal by a 180 degree phase-shift, with the first delayed version of the single-ended signal and the second delayed version of the single-ended signal forming a differential output signal.

BRIEF DESCRIPTION OF THE DRAWINGS

Aspects of this disclosure are illustrated by way of example, and not by way of limitation, in the figures of the accompanying drawings and in which like reference numerals refer to similar elements.

Like reference numbers and designations in the various drawings indicate like elements.

DETAILED DESCRIPTION

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, system or network that is capable of transmitting, receiving, and processing signals, including RF signals. By way of example, the described implementations may be realized in devices, systems, or networks that operate according to any of the IEEE 802.11 specifications, or any of the IEEE 802.15 specifications, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

Single-ended signals are often used during processing of analog signals, especially during initial processing stages. Single-ended signals may be more sensitive to noise than differential signals, which may reduce the performance of the associated device or circuit. Differential signals may be less sensitive to noise than single-ended signals because two complementary signals instead of one signal are used to transmit analog information. Since differential signaling encodes information as a voltage difference between two signals, noise sources that introduce noise on the differential signals are ignored. Using differential signals instead of single-ended signals may increase a noise tolerance of an associated device or circuit. As a result, many devices convert single-ended signals to differential signals to take advantage of the inherent noise resistance. Traditional single-ended to differential signal converters can be bulky (area inefficient) and not well suited for use in integrated circuits.

Implementations of the subject matter described in this disclosure may be used to convert a single-ended signal to differential signals (called a differential signal pair). Some implementations may be more area efficient than traditional converters. Single-ended to differential signal converters implemented with an N-path filter may be area efficient, particularly when the N-path filter is implemented with switched capacitors. In some aspects, a single-ended to differential signal converter may include an N-path filter. The N-path filter may delay a single-ended input signal by a one hundred eighty (180) degree phase delay. Together the single-ended input signal and the 180 degree phase delayed version of the single-ended input signal may be used to form a differential signal. In some implementations, the N-path filter may include a plurality of switched capacitors. The single-ended input signal may be temporarily stored in the capacitors to provide a desired amount of delay.

Figure 1:
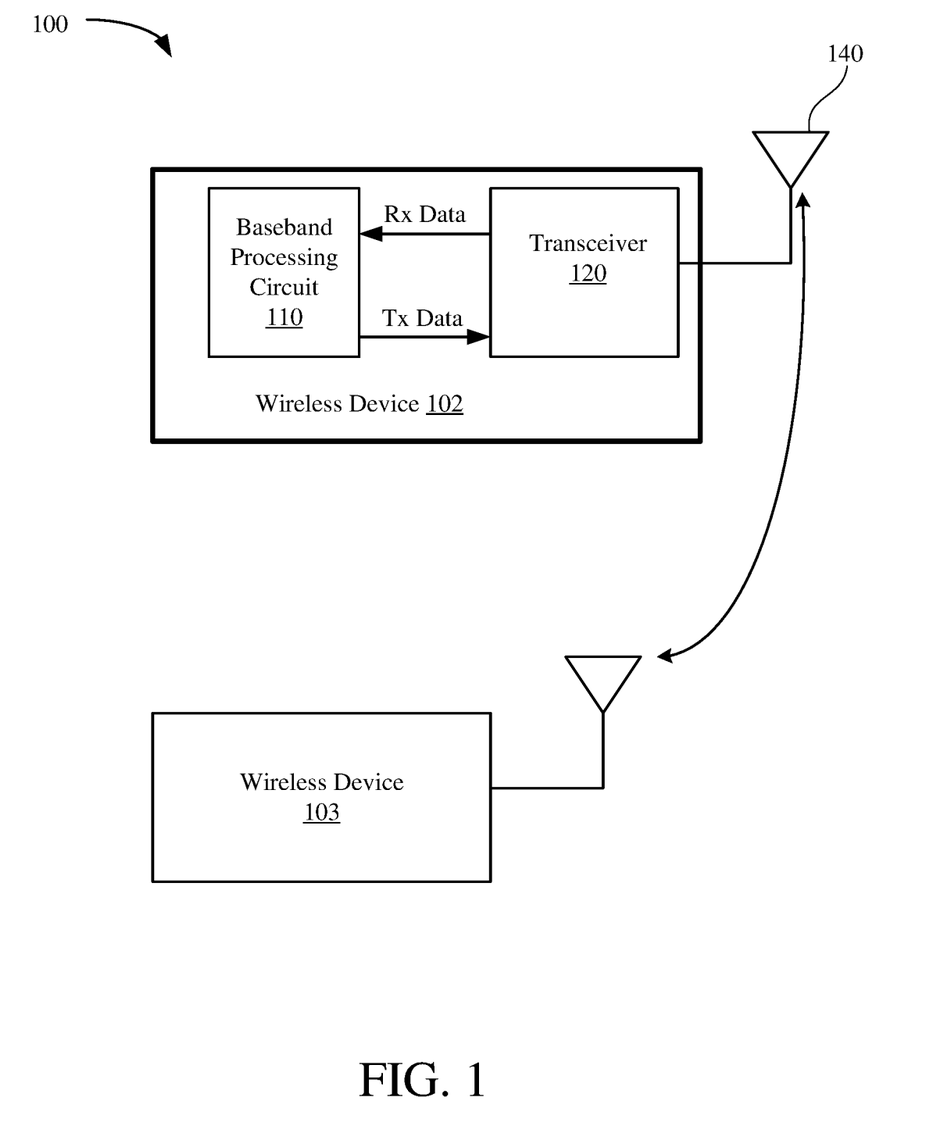
FIG. 1 shows a block diagram of an example communication system.

FIG. 1 shows a block diagram of an example communication system 100. The communication system 100 may include communication devices 102 and 103. Although only two communication devices 102 and 103 are shown in FIG. 1 for simplicity, it is to be understood that the communication system 100 may include any number of communication devices. In the communication system 100, the communication devices 102 and 103 are illustrated as wireless devices that may transmit and receive wireless communication signals. When implemented as a wireless device, the communication devices 102 and 103 may be any suitable wireless enabled device including, for example, a cell phone, laptop, tablet computer, wireless access point, or the like. Each of the communication devices 102 and 103 may also be referred to as a user equipment (UE), a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some embodiments, one of the wireless device 102 and the wireless device 103 is configured as an access point or a base station.

For at least some implementations, each of the communication devices 102 and 103 may include one or more transceivers, one or more processing resources (e.g., processors and/or ASICs), one or more memory resources, and a power source (e.g., a battery).

The one or more transceivers may include Wi-Fi transceivers, Bluetooth transceivers, cellular transceivers, and/or other suitable radio frequency (RF) transceivers (not shown for simplicity) to transmit and receive wireless communication signals. Each transceiver may communicate with other wireless devices within distinct operating frequency bands and/or using distinct communication protocols. For example, the Wi-Fi transceiver may communicate within a 2.4 GHz frequency band and/or within a 5 GHz frequency band in accordance with the IEEE 802.11 specification. The cellular transceiver may communicate within various RF bands in accordance with a 4G Long Term Evolution (LTE) protocol described by the 3rd Generation Partnership Project (3GPP) (e.g., between approximately 700 MHz and approximately 3.9 GHz) and/or in accordance with other cellular protocols (e.g., a Global System for Mobile (GSM) communications protocol). In other embodiments, the transceivers included within communication devices 102 and 103 may be any technically feasible transceiver such as a ZigBee transceiver described by a specification from the ZigBee Alliance, a WiGig transceiver, and/or a HomePlug transceiver described by a specification from the HomePlug Alliance.

In some implementations, the one or more transceivers may include wire-based transceivers (not shown for simplicity). The transceivers may communicate with each other by transmitting and receiving Ethernet, powerline communications (PLC), or other wire-based communications. Other example wire-based communications may include PCI-e, SATA, HDMI, USB or any other suitable wire-based protocol.

The communication device 102 may include a transceiver 120, a baseband processing circuit 110, and an antenna 140. Although only one antenna 140 is shown for simplicity, in other implementations, communication device 102 may include any feasible number of antennas.

The baseband processing circuit 110 may be coupled to the transceiver 120 and may provide a baseband signal to the transceiver 120 for transmission through the communication medium. The baseband processing circuit 110 may also receive a baseband signal from the transceiver 120. In some implementations, the transceiver 120 may include any number of transmit chains to process and transmit multiple data streams to other wireless devices, and may include any number of receive chains to receive and process multiple data streams from other devices. In some example implementations, the transceiver 120 may include a power amplifier to amplify communication signals for transmission via the antenna 140. The transceiver 120 may also include a low noise amplifier to receive transmitted signals from other wireless devices. The power amplifier and the low noise amplifier are not shown in FIG. 1 for simplicity.

Communication device 103 may be similar to communication device 102. For example, communication device 103 may also include a baseband processing circuit and a transceiver.

Many signals within the transceiver 120 may be single-ended signals that are converted to differential signals. Although single-ended signals may be simpler to process and transport than differential signals, differential signals can offer increased noise immunity and resistance to interference than single-ended signals. For example, in some implementations, a receive chain may include one or more single-ended to differential signal converters to convert single-ended RF signals from the antenna 140 into differential signals.

Figure 2:
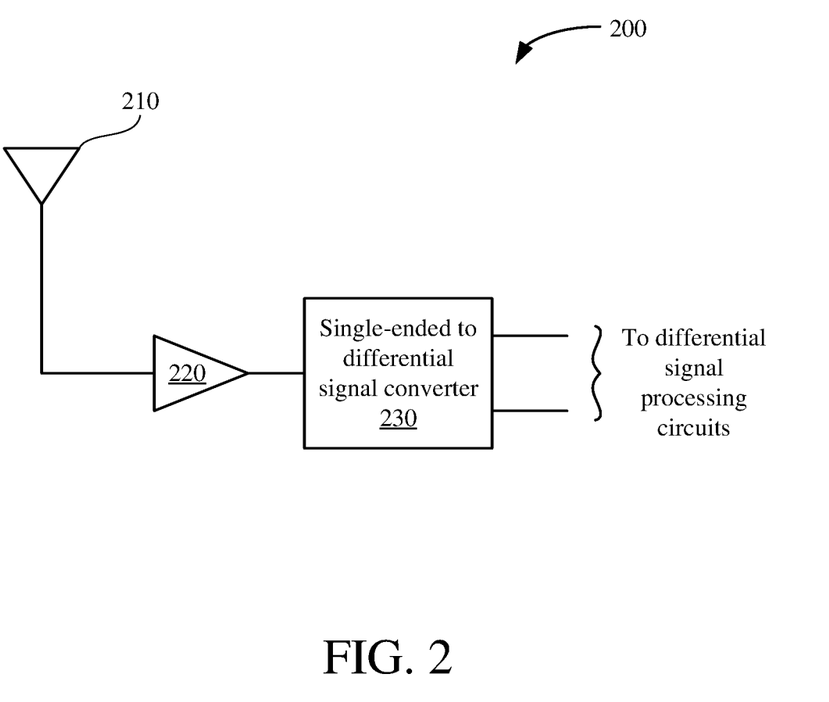
FIG. 2 shows a block diagram of at least a portion of a receive chain.

FIG. 2 shows a block diagram of at least a portion of an example receive chain 200. By way of example and not limitation, the receive chain 200 may be included as part of an analog front end of the transceiver 120 of FIG. 1. The receive chain 200 may include an antenna 210, a low noise amplifier (LNA) 220, and a single-ended to differential signal converter 230. The antenna 210 may be an implementation of the antenna 140 of FIG. 1.

The antenna 210 may be coupled to the LNA 220 and may receive single-ended RF signals from the antenna 210. After providing an amount of amplification to the single-ended signal, the LNA 220 may provide an amplified RF signal to the single-ended to differential signal converter 230. The single-ended to differential signal converter 230 receives the single-ended signal and converts the signal to a differential signal.

By way of example and not limitation, the receive chain 200 may be an independent processing chain for receiving and processing radio frequency (RF) signals within the transceiver 120. The transceiver 120 may include a plurality of receive chains. For example, the transceiver 120, may include multiple receive chains to support, for example, receive diversity and/or multiple-input multiple-output (MIMO) communications.

Although illustrated as part of a receive chain 200, the single-ended to differential signal converter 230 may be used in other sections or circuits of the transceiver 120. For example, the single-ended to differential signal converter 230 may be used in a transmit chain or in any other processing area where conversion of a single-ended signal to a differential format is desired.

Figure 3:
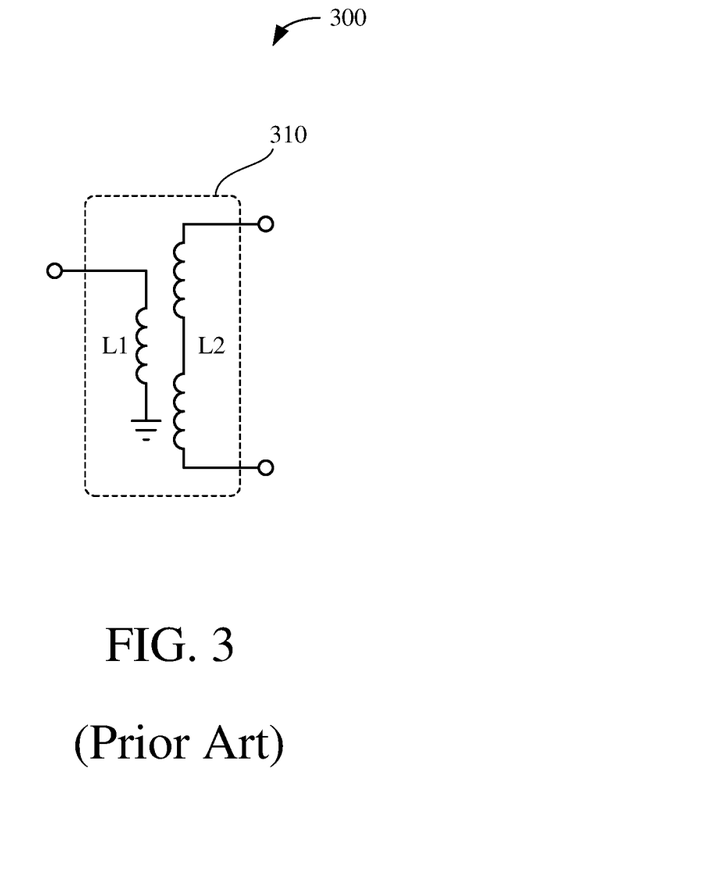
FIG. 3 is a schematic diagram of a prior art single-ended to differential signal converter.

FIG. 3 is a schematic diagram of a prior art single-ended to differential signal converter 300. The single-ended to differential signal converter 300 may include a balun 310. The balun 310 is a passive signal transformer including a first inductive element L1 and a second inductive element L2. A single-ended signal is received at a terminal of the first inductive element L1. The received single-ended signal is inductively (magnetically) coupled to the second inductive element L2. The single-ended signal induces a differential signal through the second inductive element L2.

Although the balun 310 may have a simple, two-part design, the area needed to implement the inductive elements L1 and L2 may be relatively large compared to resistors, transistors and capacitors. Large areas may have a higher associated cost, especially within integrated circuits. Additionally, because of electrical limitations associated with the inductive elements L1 and L2, the balun 310 may be lossy, particularly within some frequency ranges.

Figure 4:
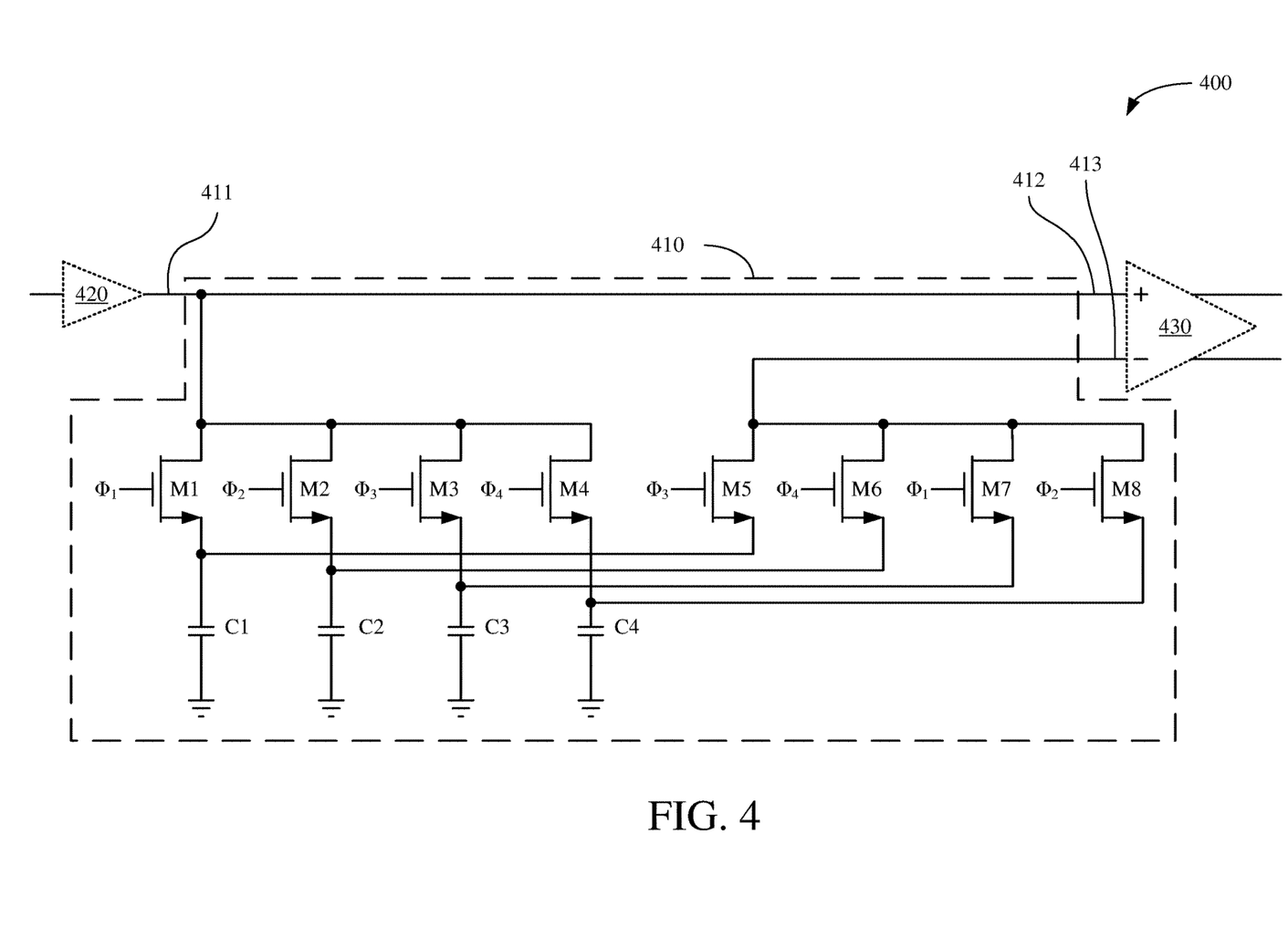
FIG. 4 is a schematic diagram of a single-ended to differential signal converter.

FIG. 4 is a schematic diagram of a single-ended to differential signal converter 400. The single-ended to differential signal converter 400 may include an N-path filter 410. In some implementations, the single-ended to differential signal converter 400 may optionally include an LNA 420 and a differential amplifier 430 (illustrated with dotted lines). The LNA 420 may buffer and/or provide amplification to a single-ended signal prior to processing by the N-path filter 410. Similarly, the differential amplifier 430 may buffer and/or provide amplification to differential signals provided by the N-path filter 410. In some embodiments, the output of the differential amplifier 430 is coupled to a mixer (not illustrated). For example, the mixer may be implemented as a double-balanced mixer configured to downconvert an RF signal to an IF or baseband frequency.

The N-path filter 410 may include a set of N number of capacitors, an input terminal 411, a first output terminal 412, a second output terminal 413, a first set of N number of transistors and a second set of N number of transistors, where N is an integer. In the example N-path filter 410, N is four. Therefore, there are four capacitors C1-C4, four transistors M1-M4 in the first set of N transistors and four transistors M5-M8 in the second set of N transistors. In other implementations, N can be any other feasible integer. Although depicted as NMOS transistors, in other implementations, the first set of N transistors and the second set of N transistors may be PMOS transistors or a mixture of NMOS and PMOS transistors. In still other implementations, the first set of N transistors and the second set of N transistors may be replaced with any other switching or coupling device. For example, the MOS transistors may be replaced with NPN or PNP bipolar transistors or any other configurable switch. In some implementations, the capacitors C1-C4 may each have an identical or similar capacitance.

Each transistor of the first set of N transistors may couple the input terminal 411 to an associated capacitor C1-C4. Thus, transistor M1 couples the input terminal 411 to capacitor C1, transistor M2 couples the input terminal 411 to capacitor C2, transistor M3 couples the input terminal 411 to capacitor C3, and transistor M4 couples the input terminal 411 to capacitor C4. In some aspects, the transistors M1-M4 may not all turn on (conduct) simultaneously. Instead, one transistor may turn on at a time. The transistors M1-M4 may be controlled by a first set of non-overlapping gate control signals provided to respective gates of the transistors M1-M4. Since the gate control signals are non-overlapping, only one capacitor C1-C4 may be coupled to the input terminal 411 at any time. In this manner, the first sequence of non-overlapping gate control signals may cause the transistors M1-M4 to store a single-ended input signal received through the input terminal 411 in the capacitors C1-C4.

Each transistor of the second set of N transistors is configured to couple the second output terminal 413 to one of the set of N capacitors C1-C4. Thus, similar to M1-M4, transistors M5-M8 may couple an associated capacitor C1-C4 to the second output terminal 413. The transistors M5-M8 may be controlled by a second set of non-overlapping gate control signals provided to their respective gate terminals. By controlling a phase offset between the first set of gate control signals and the second set of gate control signals, the N-path filter may provide a phase-shifted (delayed) version of the single-ended input signal to the second output terminal 413. When the phase offset between the first set of gate control signals and the second set of gate control signals is 180 degrees, the signal on the second output terminal 413 is a 180 degree phase-shifted (delayed) version of the single-ended differential input signal.

The first output terminal 412 may be coupled to the input terminal 411. Thus, while the single-ended input signal is provided by the first output terminal 412, the second output terminal 413 may provide a 180 degree phase-shifted (delayed) version of the same signal. In this manner, a differential output signal formed by the single-ended input signal and the 180 degree phase-shifted single-ended input signal may be provided by the N-path filter 410. As described above, N may be any integer. Increasing N (increasing the number of transistors and capacitors) may provide a more accurate 180 degree phase-shifted signal while increasing the complexity of the N-path filter 410.

As described above, a first set of gate control signals operates the transistors M1-M4 and a second set of gate control signals operates the second set of transistors M5-M8. The first set of gate control signals may be generated and/or controlled independent of the second set of gate control signals. Gate control signals are described in more detail below in conjunction with FIG. 5.

Figure 5:
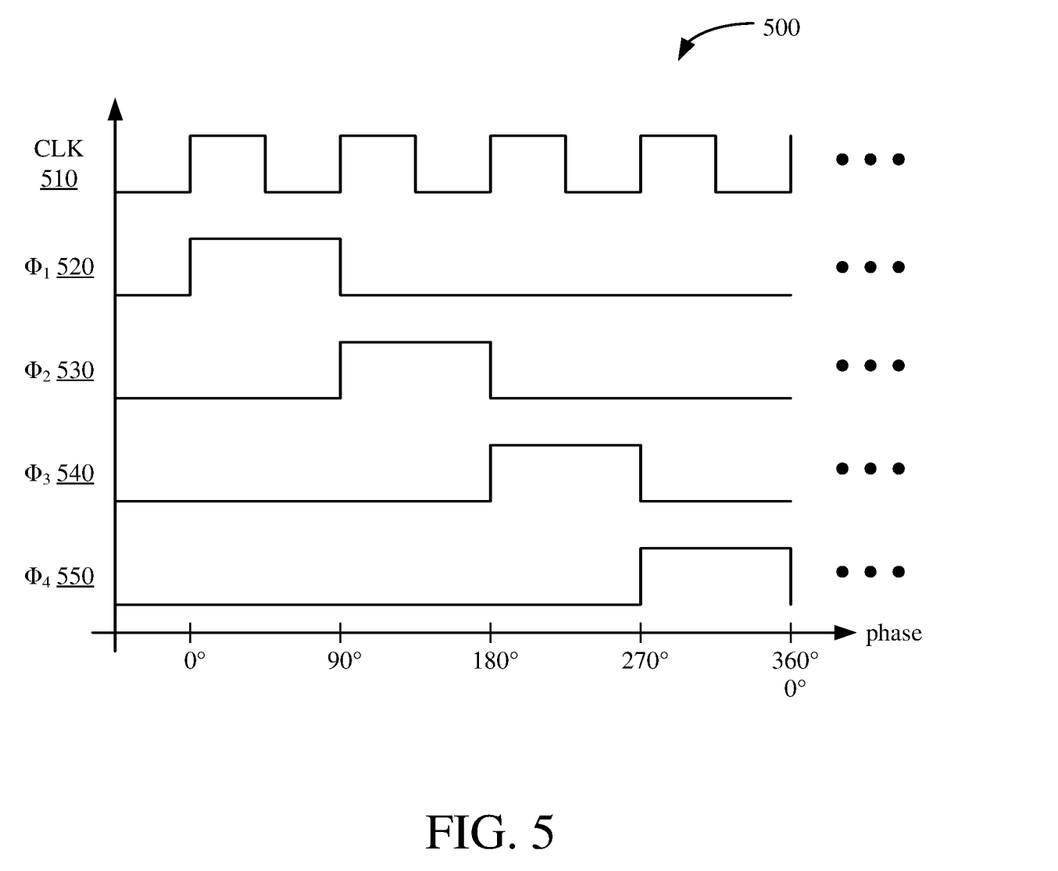
FIG. 5 is a timing diagram illustrating example gate control signals.

FIG. 5 is a timing diagram 500 illustrating example gate control signals. The example gate control signals may be for the N-path filter 410 in FIG. 4, and the number of gate control signals may be determined at least in part by the integer value of N. Four gate control signals are shown in the timing diagram 500 for illustrative purposes to correspond to the example N-path filter 410 of FIG. 4 (N equals four). In other implementations, the N-path filter 410 may be based on other integer values and, therefore, other numbers of gate control signals may be determined.

A gate control period may be defined to have 360 degrees. In some implementations, the gate control period may be divided into a number of N equal (or approximately equal) sub-periods. For the example N-path filter 410 of FIG. 4, since N equals four, the gate control period may be divided into four 90 degree sub-periods (360/4=90). In another implementation, the gate control period may be divided into eight sub-periods. Thus, each sub-period may be a 45 degree sub-period (360/8=45). Greater numbers of sub-periods may provide a more accurate phase-shifted signal. However, greater numbers of sub-periods may require more capacitors and transistors to implement.

A gate control signal may determine when a transistor of the N-path filter 410 turns on (conducts). With respect to the N-path filter 410, gate control signals may determine when the single-ended input signal at the input terminal 411 is stored in a capacitor, and gate control signals may determine when the stored signal is provided to the second output terminal 413. In some aspects, the gate control signals may be used to turn on a transistor for a 90-degree sub-period.

A clock signal 510 is plotted in the timing diagram 500 with respect to phase. In some implementations, since N equals four, four clock cycles are included in the gate control period (e.g., from 0 to 360 degrees). In some implementations, the frequency of the clock signal 510 may be a multiple of a maximum bandwidth (highest supported frequency) of the input signal processed by the N-path filter 410. For example, if the maximum bandwidth of the input signal is 1 GHz, then the frequency of the clock signal 510 may be four times the maximum bandwidth, or 4 GHz. Multiples greater than one may be used to ensure sufficient resolution in the N-path filter 410. Other implementations may support other clock frequency multiples, including fractional multiples greater than or less than one (such as 5⁄4 or ½). Notably, as N increases, the characteristics of the clock gate control signals changes. For example, a larger N may require a narrower pulse width for each gate control signal as the gate control period is divided into larger number of sub-periods. A first gate control signal 520 (denoted $\Phi_1$ in FIG. 5) may be asserted from 0-90 degrees. At all other times, the first gate control signal 520 is not asserted. Although depicted as an active high signal, in some implementations the first gate control signal 520 may be an active low signal. In other words, the first gate control signal 520 may be asserted when the signal is low and not asserted when the signal is high (not shown for simplicity).

Similar to the first gate control signal 520, a second gate control signal 530 (denoted $\Phi_2$) may be asserted from 90 to 180 degrees, a third gate control signal 540 (denoted $\Phi_3$) may be asserted from 180 to 270 degrees, and a fourth gate control signal 550 (denoted $\Phi_4$) may be asserted from 270 to 360 degrees. After 360 degrees, the phase returns to 0 degrees and the gate control signals 520-550 may repeat.

In some implementations, each gate control signal may not overlap with any other gate control signal. For example, the first gate control signal 520 may be asserted from 0 degrees to just before 90 degrees, the second gate control signal 530 may be asserted from 90 degrees to just before 180 degrees, the third gate control signal 540 may be asserted from 180 degrees to just before 270 degrees, and the fourth gate control signal 550 may be asserted from 270 degrees to just before 360 degrees. In other implementations, the first gate control signal 520 may be asserted from just after 0 degrees to 90 degrees, the second gate control signal 530 may be asserted from just after 90 degrees to 180 degrees, the third gate control signal 540 may be asserted from just after 180 degrees to 270 degrees, and the fourth gate control signal 550 may be asserted from just after 270 degrees to 360 degrees. In some other implementations, each gate control signal may overlap briefly with an adjacent gate sequence signal. For example, the first gate control signal 520 may be asserted up to and including 90 degrees while the second gate control signal 530 may be asserted beginning at 90 degrees (thereby overlapping at 90 degrees).

In one implementation, the gate control signals 520-550 may form a first set of gate control signals $\{\Phi_1, \Phi_2, \Phi_3, \Phi_4\}$ that are provided to gate terminals of the transistors M1, M2, M3, and M4 (FIG. 4), respectively. In this manner, the capacitor C1 may store the single-ended input signal when the first gate control signal 520 is asserted, capacitor C2 may store the single-ended input signal when the second gate control signal 530 is asserted, capacitor C3 may store the single-ended input signal when the third gate control signal 540 is asserted, and capacitor C4 may store the single-ended input signal when the fourth gate control signal 550 is asserted.

The gate control signals 540, 550, 520, and 530 may form a second set of gate control signals $\{\Phi_3, \Phi_4, \Phi_1, \Phi_2\}$ that are provided to gate terminals of the transistors M5, M6, M7, and M8, respectively. In this manner, the single-ended input signal stored in capacitor C1 may be provided to the second output terminal 413 when the third gate control signal 540 is asserted, the single-ended input signal stored in capacitor C2 is provided to the second output terminal 413 when the fourth gate control signal 550 is asserted, the single-ended input signal stored in capacitor C3 is provided to the second output terminal 413 when the first gate control signal 520 is asserted, and the single-ended input signal stored in capacitor C4 is provided to the second output terminal 413 when the second gate control signal 530 is asserted. Thus, the first set of gate control signals $\{\Phi_1, \Phi_2, \Phi_3, \Phi_4\}$ and the second set of gate control signals $\{\Phi_3, \Phi_4, \Phi_1, \Phi_2\}$ may be derived from the same set of four signals, but are applied to different respective transistors in the first set of N transistors M1-M4 as compared to the second set of N transistors M5-M8.

In this manner, the single-ended input signal received at the input terminal 411 may be stored (via one of the capacitors C1-C4), and then provided to the second output terminal 413 with a phase-shift (delay). The amount of delay may be determined at least in part by a timing relationship between a transistor that couples the input terminal 411 to a particular capacitor and the transistor that couples the same capacitor to the second output terminal 413. Thus, in some implementations, the delay may be determined by the gate control signals. For example, the first gate control signal 520 may be provided to the M1 transistor and the third gate control signal 540 may be provided to the M5 transistor. The first gate control signal 520 may be related to the third gate control signal by a 180 degree phase-shift. Therefore, the single-ended input signal stored via capacitor C1 may be delayed by a 180 degree phase-shift between the input terminal 411 and the second output terminal 413. A similar delay relationship may be maintained for capacitors C2, C3, and C4. Thus, the first set of gate control signals $\{\Phi_1, \Phi_2, \Phi_3, \Phi_4\}$ may be related to the second set of gate control signals $\{\Phi_3, \Phi_4, \Phi_1, \Phi_2\}$ by a 180 degree phase offset. In this manner, the single-ended input signal may be consistently delayed by 180 degrees through the N-path filter 410.

In some implementations, capacitive loading effects from the transistors M1-M8 and the capacitors C1-C4 may be unevenly distributed on the output terminals 412, 413 of the N-path filter 410. More evenly distributing the capacitance to both output terminals may improve performance by reducing any load induced gain imbalance.

Figure 6:
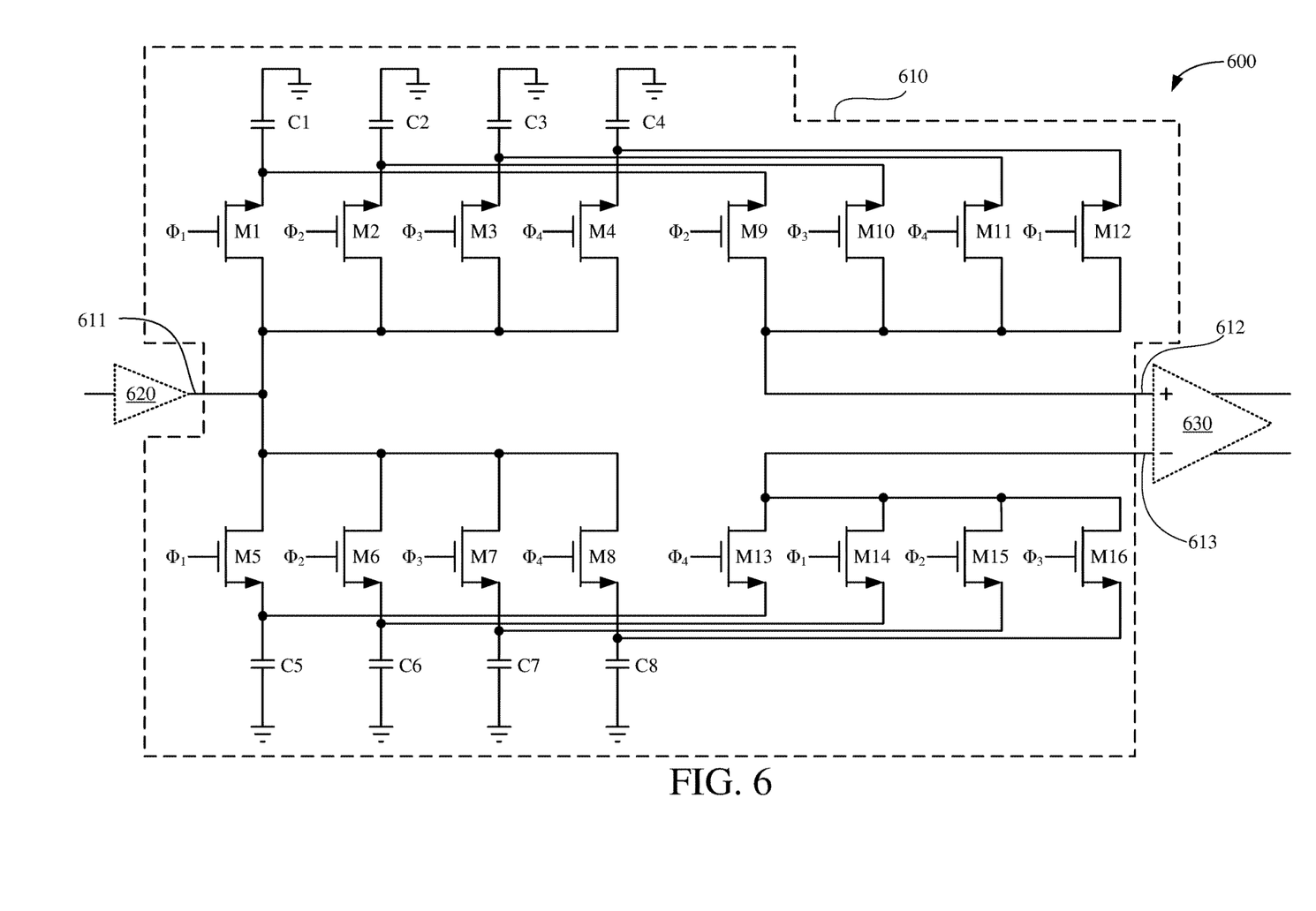
FIG. 6 is a schematic diagram of another single-ended to differential signal converter.

FIG. 6 is a schematic diagram of another example single-ended to differential signal converter 600. The single-ended to differential signal converter 600 may be one example implementation for more evenly distributing the capacitance to both output terminals. The single-ended to differential signal converter 600 may include an N-path filter 610. In some implementations, the single-ended to differential signal converter 600 may optionally include an LNA 620 and a differential amplifier 630 (illustrated with dotted lines). The LNA 620 may buffer and/or provide amplification to a single-ended signal prior to processing by the N-path filter 610. Similarly, the differential amplifier 630 may buffer and/or provide amplification to differential signals provided by the N-path filter 610.

The N-path filter 610 may include two sets of N number of capacitors, an input terminal 611, a first output terminal 612, a second output terminal 613, a first set of N number of transistors (denoted M1-M4), a second set of N number of transistors (denoted M5-M8), a third set of N number of transistors (denoted M9-M12), and a fourth set of N number of transistors (denoted M13-M16), where N is an integer. In the illustrated example N-path filter 610, the value of N is four. For the example, there are four capacitors C1-C4 in the first set of capacitors, four capacitors C5-C8 in the second set of capacitors, four transistors in the first set of N transistors, four transistors in the second set of N transistors, four transistors in the third set of N transistors and four transistors in the fourth set of N transistors. In other implementations, N can be any other feasible integer. Although depicted as NMOS transistors, in other implementations, the transistors may be PMOS transistors or a mixture of NMOS and PMOS transistors. In still other implementations, the transistors may be replaced with any other switching or coupling device. In some implementations, the capacitors C1-C8 may each have an identical or similar capacitance. In some implementations, the capacitance values of the capacitors C1-C8 may be one half the capacitance values of the capacitors in the N-path filter 410.

Similar to the capacitors of the N-path filter 410, the capacitors C1-C8 may also store the single-ended input signal. The first set of N transistors and the second set of N transistors may couple their associated capacitors to the input terminal 611. The third set of N transistors and the fourth set of N transistors may couple their associated capacitors to the first output terminal 612 and the second output terminal 613, respectively. The first and second set of N transistors may be controlled by a first set of gate control signals, the third set of N transistors may be controlled by a second set of gate control signals, and the fourth set of N transistors may be controlled by a third set of gate control signals.

By controlling a phase difference between the first set of gate control signals, the second set of gate control signals, and the third set of gate control signals, the N-path filter 610 may provide a phase-shifted (delayed) version of the single-ended input signal to the first output terminal 612 and the second output terminal 613. The phase difference between the second set of gate control signals and the third set of gate control signals is 180 degrees, thereby providing a signal on the first output terminal 612 that is 180 degrees phase-shifted (delayed) with respect to the signal on the second output terminal 613. In addition, the first set of gate control signals is configured to store the single-ended input signal in the capacitors C1-C8. The first set of gate control signals may be selected to not coincide with the second and third set of gate control signals. In some implementations, the first set of gate control signals may be related to the second set of gate control signals and/or the third set of gate controls signals by a phase offset. To ensure that the first set of gate control signals does not coincide with the second or third set of gate control signals, the first set of gate control signals may be offset from the second or third set of gate control signals by any phase offset except 0 or 180 degrees. In this manner, any one capacitor may be coupled to the input terminal 611 or to one of the output terminals 612 or 613, but not to both the input terminal 611 and one of the output terminals 612 and 613 at the same time.

As illustrated in FIG. 6, the first set of N transistors and the second set of N transistors may be controlled by a first set of gate control signals $\{\Phi_1, \Phi_2, \Phi_3, \Phi_4\}$, the third set of N transistors may be controlled by a second set of gate control signals $\{\Phi_2, \Phi_3, \Phi_4, \Phi_1\}$, and the fourth set of N transistors may be controlled by a third set of gate control signals $\{\Phi_4, \Phi_1, \Phi_2, \Phi_3\}$. The first set of gate control signals $\{\Phi_1, \Phi_2, \Phi_3, \Phi_4\}$ may cause the first set of N transistors and the second set of N transistors to sample and store the single-ended input signal in the capacitors C1-C8. The second set of gate control signals $\{\Phi_2, \Phi_3, \Phi_4, \Phi_1\}$ may cause the third set of N transistors to provide to the first output terminal 612 the stored single-ended input signal delayed by a phase-shift of 90 degrees (with respect to the single-ended input signal). The third set of gate control signals $\{\Phi_4, \Phi_1, \Phi_2, \Phi_3\}$ may cause the fourth set of N transistors to provide to the second output terminal 613 the stored single-ended input signal delayed by a phase-shift of 270 degrees. In this manner, the second set of gate control signals $\{\Phi_2, \Phi_3, \Phi_4, \Phi_1\}$ and the third set of gate control signals $\{\Phi_4, \Phi_1, \Phi_2, \Phi_3\}$ may provide delayed versions of the single-ended input signal at the output terminals, with each version separated by a phase difference of 180 degrees. In other words, a differential output signal may be generated by the 90 degree phase-shifted single-ended input signal provided to the first output terminal 612 and the 270 degree phase-shifted single-ended input signal provided to the second output terminal 613.

Of note, the first set of N transistors may sample and store the single-ended input signal (i.e., an input signal voltage) 90 degrees before the stored signal is sampled by the second or third set of transistors. Another possible set of gate control signals for the first set of transistors is $\{\Phi_3, \Phi_4, \Phi_1, \Phi_2\}$. The set of gate control signals $\{\Phi_3, \Phi_4, \Phi_1, \Phi_2\}$ may continue to isolate the sampling and storing of data (voltages) from the retrieval of stored voltage information.

The gate control signals as described herein (e.g., with respect to FIGS. 4-6) may be generated by one or more components or circuits. For example, such control signals may be generated or provided by the baseband processing circuit 110, or another controller or processor, or may be provided by another component configured to provide signals pursuant to a clock.

As described above, the single-ended to differential signal converter 400 of FIG. 4 or the single-ended to differential signal converter 600 of FIG. 6 may advantageously convert single-ended signals to differential signals in a smaller amount of area compared to conventional approaches. In one example implementation, a single-ended to differential signal converter may include a means for receiving the single-ended signal, a means for outputting a first and a second signal of a differential signal pair, a first plurality of means each for storing a respective portion of the single-ended signal, a first plurality of means each for selectively coupling the single-ended signal to a respective one of the first plurality of means each for storing, a first plurality of means each for selectively coupling a respective one of the first plurality of means each for storing to the means for outputting the first signal, and a means for controlling the first plurality of means each for selectively coupling the single-ended signal with a first set of signals and the first plurality of means each for selectively coupling to the means for outputting with a second set of signals, the first set of signals and the second set of signals differing by a phase offset.

In another example implementation, a method for converting a single-ended signal to a differential signal may include receiving the single-ended signal, directly coupling the single-ended signal to a first output terminal, storing the singled-ended signal within a plurality of capacitors via a first set of transistors, and coupling the plurality of capacitors to a second output terminal via a second set of transistors. Further, the method may include controlling the first set of transistors and the second set of transistors by a first set of control signals and a second set of control signals, respectively.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described throughout. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single-chip or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A single-ended to differential signal converter comprising:
   an input terminal;
   an N-path filter comprising:
      a first terminal coupled to the input terminal and configured to receive a single-ended signal; and
      a second terminal configured to provide a 180 degree phase-shifted version of the single-ended signal,
      wherein the single-ended signal and the 180 degree phase-shifted version of the single-ended signal form a differential output signal.
2. The single-ended to differential signal converter of claim 1, wherein the N-path filter further comprises:
   a set of N capacitors, where N is an integer;

a first set of N transistors, each of the first set of N transistors configured to couple a corresponding capacitor of the set of N capacitors to the first terminal of the N-path filter; and a second set of N transistors, each of the second set of N transistors configured to couple a corresponding capacitor of the set of N capacitors to the second terminal of the N-path filter.

3. The single-ended to differential signal converter of claim 2, wherein the first set of N transistors is controlled by a first set of gate control signals and the second set of N transistors is controlled by a second set of gate control signals, the first set of gate control signals related to the second set of gate control signals by a 180 degree phase offset.

4. The single-ended to differential signal converter of claim 3, wherein the first set of gate control signals is configured to turn on at most one transistor of the first set of N transistors at a time.

5. The single-ended to differential signal converter of claim 3, wherein the first set of gate control signals and the second set of gate control signals are based on a clock signal with a frequency that is a multiple of a maximum bandwidth of the single-ended signal.

6. The single-ended to differential signal converter of claim 5, wherein the multiple is greater than 1.

7. The single-ended to differential signal converter of claim 2, wherein the set of N capacitors is configured to store and delay the single-ended signal.

8. The single-ended to differential signal converter of claim 1, wherein the input terminal is coupled to an output of a low noise amplifier and the first terminal and the second terminal are coupled to a differential amplifier.

9. A single-ended to differential signal converter comprising:
an input terminal;
an N-path filter comprising:
a first terminal coupled to the input terminal and configured to receive a single-ended signal;
a second terminal configured to provide a first delayed version of the single-ended signal; and
a third terminal configured to provide a second delayed version of the single-ended signal related to the first delayed version of the single-ended signal by a 180 degree phase-shift,
wherein the first delayed version of the single-ended signal and the second delayed version of the single-ended signal form a differential output signal.

10. The single-ended to differential signal converter of claim 9, wherein the N-path filter further comprises:
a first set of N capacitors, where N is an integer;
a first set of N transistors, each of the first set of N transistors configured to couple a corresponding capacitor of the first set of N capacitors to the second terminal of the N-path filter;
a second set of N capacitors; and
a second set of N transistors, each of the second set of N transistors configured to couple a corresponding capacitor of the second set of N capacitors to the third terminal of the N-path filter.

11. The single-ended to differential signal converter of claim 10, wherein the first set of N transistors is controlled by a first set of gate control signals and the second set of N transistors is controlled by a second set of gate control signals, the first set of gate control signals related to the second set of gate control signals by a 180 degree phase offset.

12. The single-ended to differential signal converter of claim 11, wherein the first set of gate control signals and the second set of gate control signals are based on a clock signal with a frequency that is a multiple of a maximum bandwidth of the single-ended signal.

13. The single-ended to differential signal converter of claim 12, further comprising:
a third set of N transistors, each of the third set of N transistors configured to couple a corresponding capacitor of the first set of N capacitors to the first terminal of the N-path filter.

14. The single-ended to differential signal converter of claim 13, wherein the third set of N transistors is controlled by a third set of gate control signals, the third set of gate control signals related to the first set of gate control signals or the second set of gate control signals by a phase offset.

15. The single-ended to differential signal converter of claim 14, wherein the phase offset is not zero or 180 degrees.

16. The single-ended to differential signal converter of claim 14, further comprising:
a fourth set of N transistors, each of the fourth set of N transistors configured to couple a corresponding capacitor of the second set of N capacitors to the first terminal.

17. The single-ended to differential signal converter of claim 16, wherein the fourth set of N transistors is controlled by the third set of gate control signals.

18. The single-ended to differential signal converter of claim 9, wherein the input terminal is coupled to an output of a low noise amplifier and the second terminal and the third terminal are coupled to a differential amplifier.

19. An apparatus for converting a single-ended signal to a differential signal, comprising:
means for receiving the single-ended signal;
means for outputting a first signal of a pair of differential signals;
means for outputting a second signal of the pair of differential signals;
a first plurality of means each for storing a respective portion of the single-ended signal;
a first plurality of means each for selectively coupling the single-ended signal to a respective one of the first plurality of means each for storing;
a first plurality of means each for selectively coupling a respective one of the first plurality of means each for storing to the means for outputting the first signal; and
means for controlling the first plurality of means each for selectively coupling the single-ended signal with a first set of signals and the first plurality of means each for selectively coupling to the means for outputting the first signal with a second set of signals, the first set of signals and the second set of signals differing by a first phase offset.

20. The apparatus of claim 19, wherein the means for receiving is directly coupled to the means for outputting the second signal.

21. The apparatus of claim 20, wherein the first phase offset is based on a clock signal with a frequency that is a multiple of a maximum bandwidth of the single-ended signal.

22. The apparatus of claim 21, wherein the first phase offset is 180 degrees.

23. The apparatus of claim 19, further comprising:
a second plurality of means each for storing a respective portion of the single-ended signal;

a second plurality of means each for selectively coupling the single-ended signal to a respective one of the second plurality of means each for storing;

a second plurality of means each for selectively coupling a respective one of the second plurality of means each for storing to the means for outputting the second signal; and means for controlling the second plurality of means each for selectively coupling the single-ended signal with a third set of signals and the second plurality of means each for selectively coupling to the means for outputting the second signal with a fourth set of signals, the third set of signals and the fourth set of signals differing by a second phase offset.

24. The apparatus of claim 23, wherein the second set of signals and the fourth set of signals differ by a third phase offset, the third phase offset being different than the first phase offset and the second phase offset.

25. The apparatus of claim 19, further comprising:

means for differentially amplifying the first signal of the pair of differential signals and the second signal of the pair of differential signals.

26. The apparatus of claim 19, further comprising means for downconverting a first signal and a second signal output from the means for differentially amplifying.

* * * * *